(12) United States Patent
Shumarayev et al.

(10) Patent No.: US 6,351,144 B1
(45) Date of Patent: Feb. 26, 2002

(54) PROGRAMMABLE LOGIC DEVICE WITH UNIFIED CELL STRUCTURE INCLUDING SIGNAL INTERFACE BUMPS

(75) Inventors: Sergey Shumarayev, San Leandro; Wei-Jen Huang, Burlingame; Rakesh Patel, Cupertino, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/615,926

(22) Filed: Jul. 13, 2000

Related U.S. Application Data

(60) Provisional application No. 60/143,976, filed on Jul. 15, 1999.

(51) Int. Cl.[7] ............................ G06F 7/38; H01L 25/00; H05K 7/02
(52) U.S. Cl. ............................ 326/41; 326/47; 257/723; 257/724; 361/783
(58) Field of Search .................... 326/41, 47; 361/783, 361/760; 257/723, 724, 786

(56) References Cited

U.S. PATENT DOCUMENTS

| | | | | |
|---|---|---|---|---|
| 5,512,765 A | * | 4/1996 | Gaverick .................... 257/202 |
| 5,642,262 A | * | 6/1997 | Terrill et al. ................. 361/783 |
| 5,976,953 A | * | 11/1999 | Zavracky et al. ............ 438/455 |
| 6,100,581 A | * | 8/2000 | Wakefield et al. .......... 257/692 |

* cited by examiner

*Primary Examiner*—Michael Tokar
*Assistant Examiner*—V. Tan
(74) *Attorney, Agent, or Firm*—Pennie & Edmonds LLP

(57) ABSTRACT

A programmable logic device including a set of aligned unified cells, with each unified cell including one or more logic array blocks and a set of signal interface bumps. An input/output band of each unified cell is aligned with input/output bands of adjacent unified cells. A trace is positioned between each signal interface bump and the input/output band. The input/output band of each unified cell is responsible for providing an input/output interface for the logic array block(s) of that unified cell. Signal interface bumps of a unified cell may be coupled to those of another cell via the package. As a result, row and column interconnect circuitry present in conventional programmable logic devices can be obviated. In another aspect of the invention, a grid of signal interface bumps is formed on a die. A package with a solder ball is positioned within the grid of signal interface bumps. A set of package routing leads is positioned between the grid of signal interface bumps and the solder ball.

23 Claims, 5 Drawing Sheets

PROGRAMMABLE LOGIC DEVICE WITH UNIFIED CELL STRUCTURE INCLUDING SIGNAL INTERFACE BUMPS

This application claims priority to the provisional patent application entitled "Programmable Logic Device with Unified Cell Structure Including Signal Interface Bumps," filed Jul. 15, 1999, Ser. No. 60/143,976.

BRIEF DESCRIPTION OF THE INVENTION

This invention relates generally to programmable logic devices. More particularly, this invention relates to a programmable logic device with a unified cell structure including signal interface bumps to facilitate improved signal integrity.

BACKGROUND OF THE INVENTION

Increasing die sizes and packaging densities of programmable logic devices has resulted in both longer and finer signal paths. These paths have resulted in increased signal skew, signal delay, and diminished signal integrity. It would be highly desirable to reduce these problems associated with prior art programmable logic devices.

Prior art programmable logic devices typically have their signal input/output connections in a peripheral configuration. It would be highly desirable to provide a programmable logic device with standard cell elements resulting in a simplified input/output connection architecture. Such a feature would simplify the layout, routing, and fabrication of the programmable logic device. Such a feature would also improve signal integrity associated with the programmable logic device.

SUMMARY OF THE INVENTION

A programmable logic device includes a set of aligned unified cells, with each unified cell including a set of signal interface bumps. An input/output band of each unified cell is aligned with input/output bands of adjacent unified cells. A trace is positioned between each signal interface bump of a unified cell and the input/output band of the unified cell. The input/output band of each unified cell is responsible for providing an input/output interface for the logic array block(s) of that unified cell.

In another aspect of the invention, a grid of signal interface bumps is formed on a die. A package with a solder ball is positioned within the grid of signal interface bumps. A set of package routing leads connects the grid of signal interface bumps and the solder ball. External signals can be provided to the unified cells via the solder ball and the package routing leads.

The invention provides a programmable logic device with standard cell elements resulting in a regular signal input/output connection architecture. This simplifies the layout, routing, and fabrication of the programmable logic device. The chip-to-package connections of the invention improve signal integrity associated with the programmable logic device.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
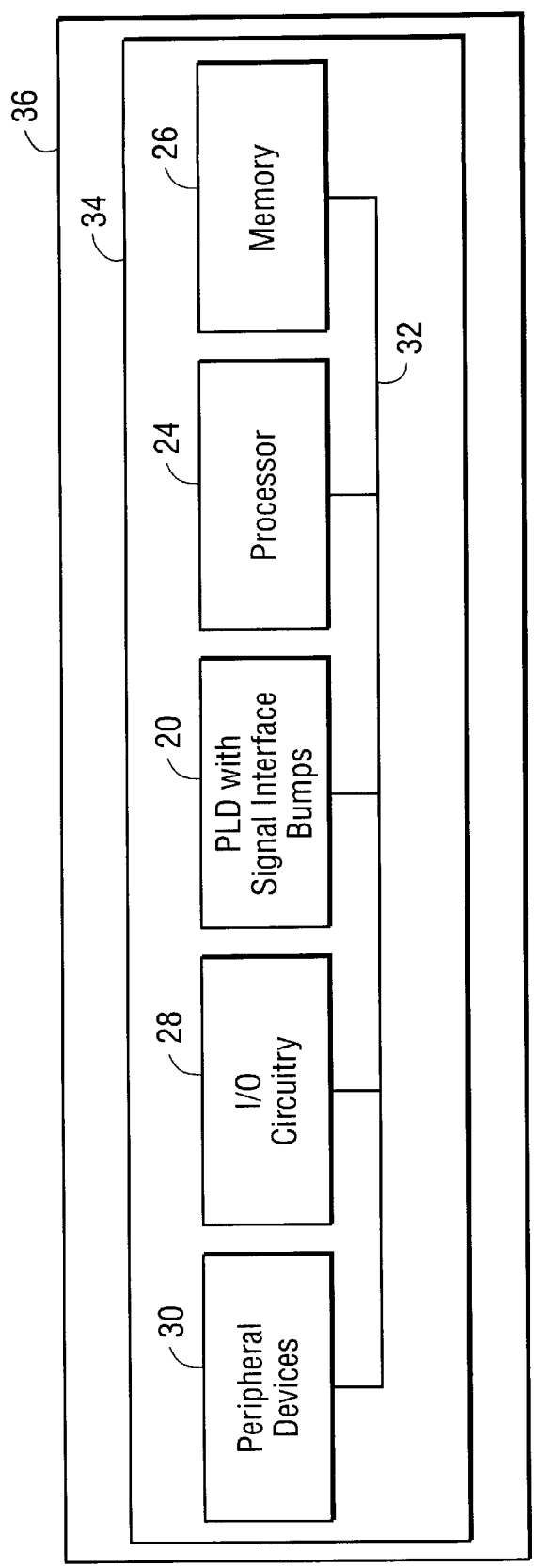
FIG. 1 illustrates a signal processing system incorporating a programmable logic device of the invention.

FIG. 1 illustrates a programmable logic device (PLD) 20 incorporating signal interface bumps in accordance with the invention. PLDs (sometimes referred to as PALs, PLAs, FPLAs, PLDs, EPLDs, EEPLDs, LCAs, or FPGAs) are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the Altera Data Book, June 1996, all incorporated herein by reference. The latter are described in, for example, U.S. Pat. Nos. 5,258,668; 5,260,610; 5,260,611; and 5,436,575, and the Altera Data Book, June 1996, all incorporated herein by reference.

The PLD 20 forms a part of a data processing system 22. The data processing system 22 may include one or more of the following components: a processor 24, a memory 26, input/output circuitry 28, and peripheral devices 30. These components are coupled together by a system bus 32 and are populated on a circuit board 34, which is contained in an end-user system 36.

The system 22 can be used in a wide variety of applications, such as computer networking, data networking, instrumentation, video processing, digital signal processing, or any other application where the advantage of using re-programmable logic is desirable. The PLD 20 can be used to perform a variety of logic functions. For example, the PLD 20 can be configured as a processor or controller that works in cooperation with processor 24. The PLD 20 may also be used as an arbiter for arbitrating access to a shared resource in the system 22. In yet another example, the PLD 20 can be configured as an interface between the processor 24 and one of the other components in the system 22.

Figure 2:
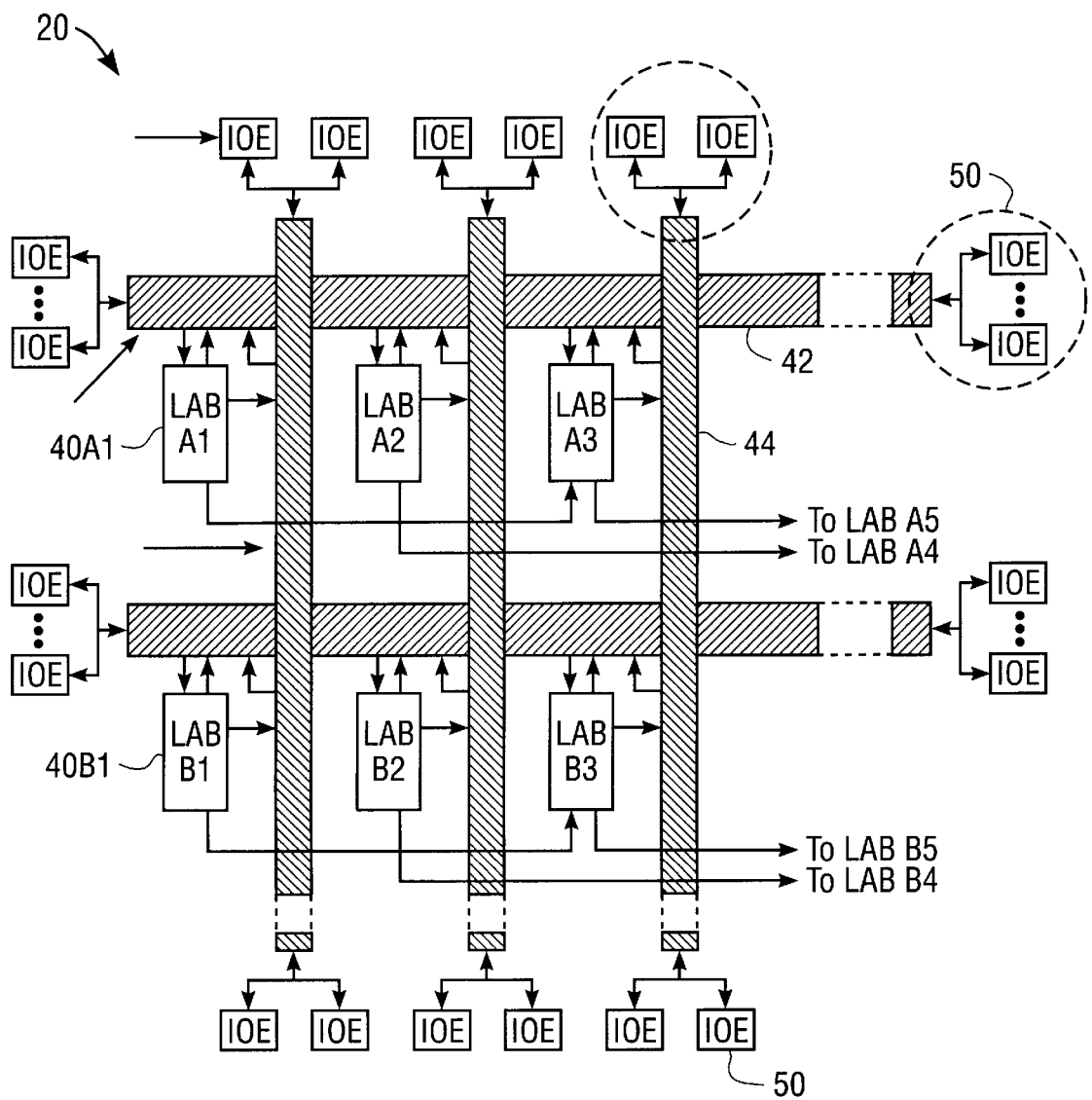
FIG. 2 is a general illustration of a programmable logic device.

FIG. 2 illustrates a general programmable logic device 20. The programmable logic device 20 includes a set of logic array blocks 40. As known in the art, a logic array block 40 performs programmed logic operations. Row interconnect circuitry 42 and column interconnect circuitry 44 link the various logic array blocks 40. Row interconnect circuitry 42 and column interconnect circuitry 44 are known in the art. The invention may be constructed using logic array blocks 40, row interconnect circuitry 42, and column interconnect circuitry 44 of the type used in the MAX® and FLEX® series of PLDs sold by Altera Corporation, San Jose, Calif.

Input/output elements 50 are positioned at the ends of the row interconnect circuitry 42 and column interconnect circuitry 44. The input/output elements 50 are used for standard input/output functions. The input/output elements 50 include input buffers and output buffers.

Figure 3A:
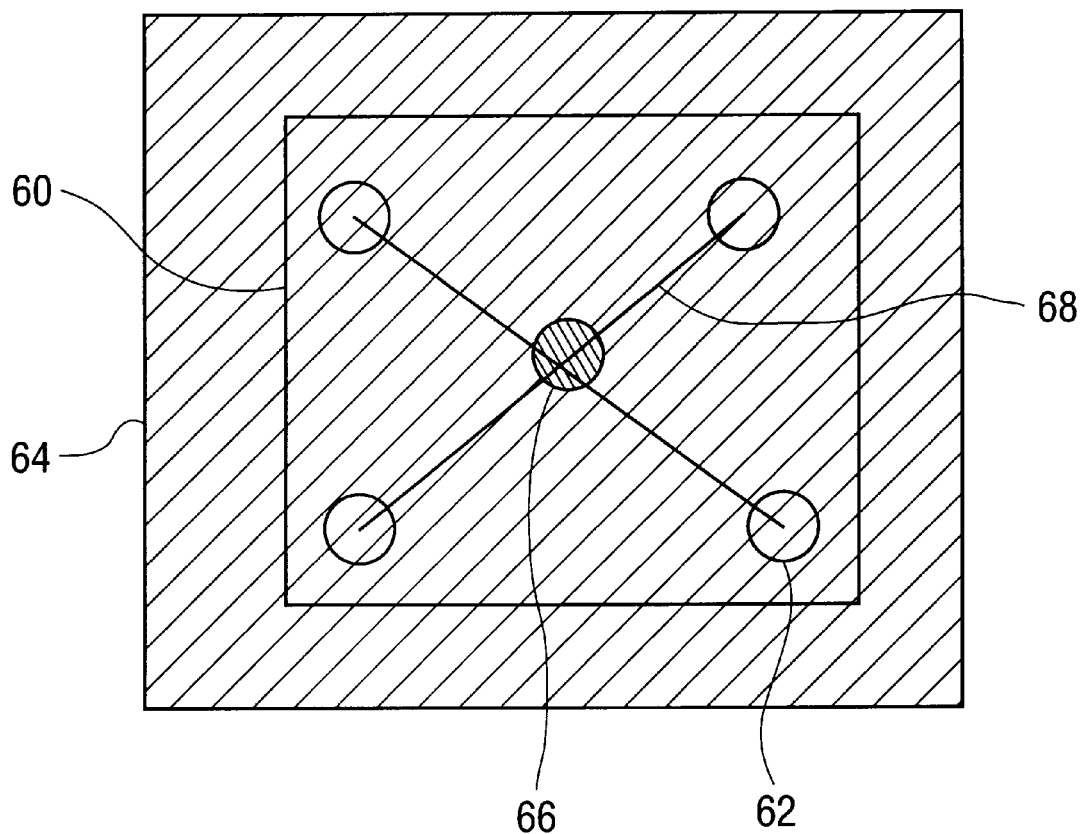
FIG. 3A is a plan view of die-to-package interconnections in accordance with an embodiment of the invention.

FIG. 3A illustrates a portion of a die 60 forming a portion of programmable logic device 20 in accordance with an embodiment of the invention. The die includes signal interface bumps 62. The die 60 is attached to a package 64, which includes a solder ball 66. Package routing leads 68 connect the interface bumps 62 to the solder ball 66.

Figure 3B:
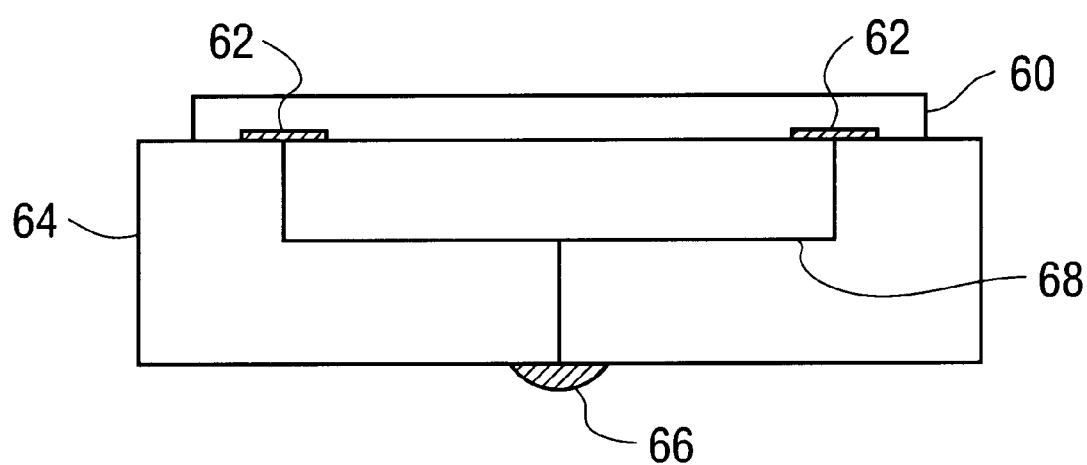
FIG. 3B is a side view of the die-to-package system of FIG. 3A.

FIG. 3B is a side view of the device of FIG. 3A. FIG. 3B illustrates the package 64 with a solder ball 66 and internal traces 68. The figure further illustrates the die 60 with interface bumps 62 connected to the internal traces 68. FIG. 3B illustrates the die 60 in a flip-chip configuration. Observe that in this configuration the routing of the signal from the solder ball 66 is performed within the package 64, thereby achieving reduced signal skew in contrast to the case where a common signal is routed on the die 60. In other words, the invention exploits the reduced signal skew associated with a package.

The external signal from the solder ball 66 is routed within the package to multiple bumps 62 that are strategically placed over the chip in such a manner as to minimize multiple fanout signal skew. Depending on the relative locations of destination points in the chip, the ball and bumps are optimally placed to minimize maximum and/or average skew. For example, to minimize worst-case skew for destination points randomly distributed in the chip (such as global clock signals in a PLD that route to all registers), bumps 62 are placed in the center of the four quadrants of the die. Placement of the solder ball 66 in the center over the die 60 is preferred, but not necessary as long as the routing is properly matched between branch routing towards the bumps. Other arrangements are possible such as placing the bumps in the centers of the top and bottom halves of the die. Routing on chip from the bumps can be continued in a tree fashion (e.g., an H-Tree) to provide the least skew within the die. Package routing toward the different bumps under any arrangement is preferably matched in layer material and dimensions along the path and preferably has shielding as needed to minimize noise.

This configuration provides improved signal skew over that achievable on chip because of the lower resistance afforded by package routing layers. Similarly, signal delay is also improved when a bump is placed as near the chip destination point as possible. Routing congestion issues arising from the need to provide low skew and delay on chip are also reduced when much of this routing is transferred outside the programmable logic device.

Figure 4:
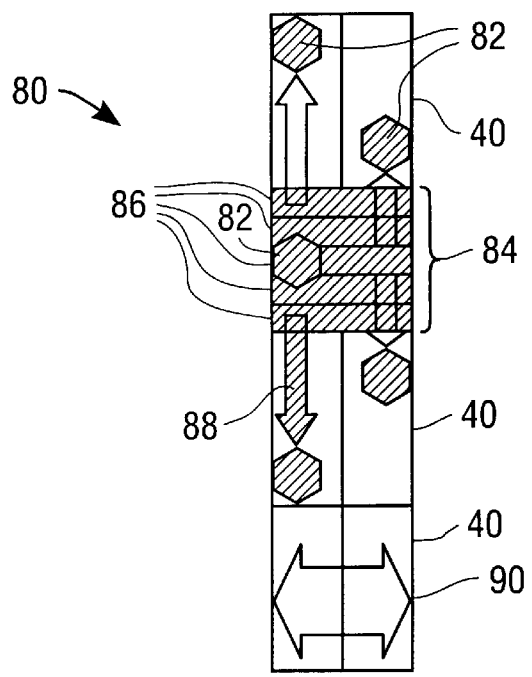
FIG. 4 illustrates a unified cell for a programmable logic device in accordance with an embodiment of the invention.

FIG. 4 illustrates a unified cell that may be used to construct a programmable logic device 20 in accordance with an embodiment of the invention. The unified cell 80 includes a grouping of logic array blocks 40. Distributed on the unified cell 80 are signal interface bumps 82 of the type discussed in connection with FIGS. 3A and 3B. Preferably, the signal interface bumps 82 are configured as hexagons, which readily scale to different device sizes. The scaling factor is the desired number of technology generations from the expected minimum bump pitch.

FIG. 4 also illustrates an input/output band 84, which includes various cells 86, which may be, for example, input/output cells or power cells. Traces 88 are used to electrically connect signal drivers from the input/output band 84 to bumps 82. A separate power bus 90 may also be formed on the unified cell 80. The unified cell includes all necessary secondary signals, test signals, and routing between these elements.

Figure 5:
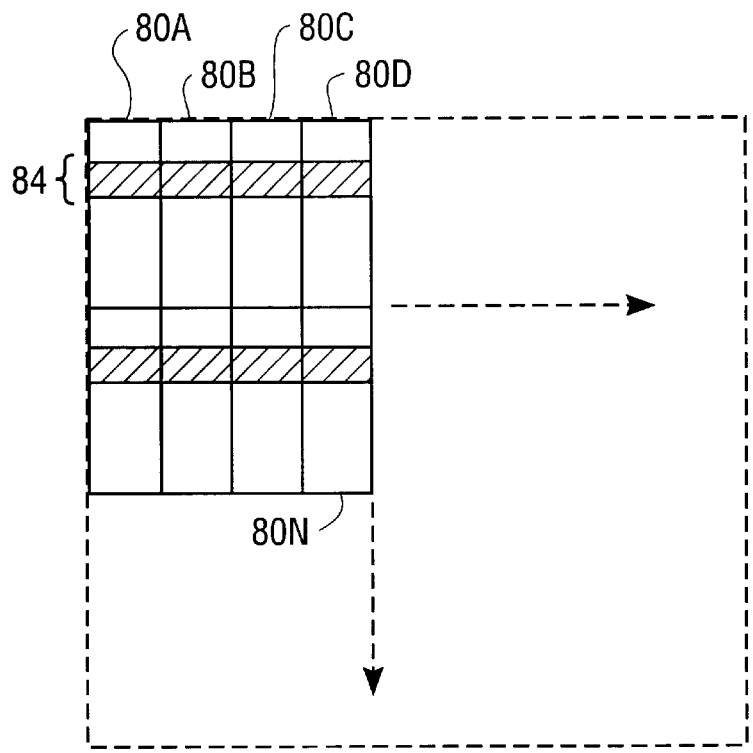
FIG. 5 illustrates the continuous input/output bands formed in accordance with an embodiment of the invention.

FIG. 5 illustrates that individual unified cells 80A–80N may be combined to form an array of unified cells. Observe in FIG. 5 that the input/output band 84 forms a continuous input/output band across the horizontal length of the device.

The bumps 82 may be used for flip-chip connections. Thus, in this configuration, the bumps 82 of a logic array block 40 are attached to bumps 82 of an input/output band 84 via package routing. Alternately, wires may be used to selectively connect bumps 82.

The unified cell approach of the invention results in regular signal input/output connection architectures. This configuration simplifies the layout, routing, and fabrication of the programmable logic device. Thus, the configuration of the invention can reduce the time to market for a programmable logic device.

Those skilled in the art will recognize a number of benefits associated with the disclosed technology. For example, by placing bumps 82 over the general logic, the need for a separate die area for bonding pads is eliminated. The input/output bands of the invention result in favorable area versus speed tradeoffs.

Observe that the structure of FIG. 5 eliminates the distinction between vertical and horizontal input/output, which simplifies software and timing since all of the input/outputs can be either vertical or horizontal. It should also be noted that input/output elements (e.g., input/output elements 50) may not be necessary. The invention provides shorter average input/output-to-logic paths, resulting in better timing performance. The architecture of FIG. 5 also places power cells according to a grid, instead of peripherally, thereby enhancing the power network.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A programmable logic device, comprising:
   a set of aligned cells on a die, each aligned cell including
      a plurality of logic array blocks,
      an input/output band on the die for providing an input/output interface for said plurality of logic array blocks, and
      a set of signal interface bumps to facilitate the exchange of signals between said logic array blocks and said input/output band.

2. The programmable logic device of claim 1 further comprising traces connecting selected signal interface bumps to said input/output band.

3. The programmable logic device of claim 1, further comprising:
   a package;
   a solder ball positioned on said package, said solder ball configured for receiving an external signal; and a set of package routing leads connecting said solder ball to selected signal interface bumps, wherein said set of package routing leads distribute said external signal to said selected signal interface bumps.

4. The programmable logic device of claim 3, wherein said package routing leads are configured for substantially uniform fanout delay to each of said selected signal interface bumps.

5. The programmable logic device of claim 1, wherein said input/output band comprises input/output cells.

6. The programmable logic device of claim 1, wherein said input/output band comprises power cells.

7. The programmable logic device of claim 1, wherein said input/output band is aligned with input/output bands of adjacent cells.

8. The programmable logic device of claim 3, further comprising a power bus for distributing power to said set of aligned cells.

9. The programmable logic device of claim 1, wherein each signal interface bump of said set of signal interface bumps has a hexagonal configuration.

10. A programmable logic device package, comprising;
    a die;
    a plurality of signal interface bumps formed on said die, wherein each signal interface bump of said plurality of signal interface bumps has a hexagonal configuration;
    a package attached to said die, said package further comprising a solder bump coupled to said plurality of signal interface bumps for communicating an external signal through said package to said plurality of signal interface bumps.

11. The programmable logic device package as recited in claim 10, further comprising package routing leads for connecting said solder bump to said plurality of signal interface bumps.

12. The programmable logic device package as recited in claim 10,
    wherein said die comprises a set of aligned cells, each aligned cell including
        a plurality of logic array blocks, and
        an input/output band for providing an input/output interface for said plurality of logic array blocks;
    said die further comprising signal traces to connect at least a subset of said plurality of signal interface bumps to said input/output band.

13. The programmable logic device package of claim 12, wherein said input/output band comprises input/output cells.

14. The programmable logic device package of claim 12, wherein said input/output band comprises power cells.

15. The programmable logic device of claim 12, wherein said input/output band is aligned with input/output bands of adjacent cells.

16. The programmable logic device of claim 12, wherein each of said aligned cells comprises a power bus for distributing power among said set of aligned cells.

17. A programmable logic device, comprising:
    a set of aligned cells, each aligned cell including
        a plurality of logic array blocks,
        an input/output band for providing an input/output interface for said plurality of logic array blocks, and
        a set of signal interface bumps to facilitate the exchange of signals between said logic array blocks and said input/output band, wherein each signal interface bump of said set of signal interface bumps has a hexagonal configuration.

18. A programmable logic device, comprising:
    a set of aligned cells, each aligned cell including:
        a plurality of logic array blocks,
        an input/output band for providing an input/output interface for said plurality of logic array blocks, the input/output band having a plurality of input/output cells, and
        a set of signal interface bumps situated on said logic array blocks and said input/output band.

19. The programmable logic device of claim 18, wherein each aligned cell includes signal traces coupling at least a subset of said input/output cells to at least a subset of said signal interface bumps.

20. The programmable logic device of claim 18, comprising:
    a package;
    a solder ball positioned on said package, said solder ball configured for receiving an external signal; and
    a set of package routing leads connecting said solder ball to selected ones of said signal interface bumps, wherein said set of package routing leads distribute said external signal to said selected signal interface bumps.

21. The programmable logic device of claim 20, wherein said package routing leads are configured for substantially uniform fanout delay to each of said selected signal interface bumps.

22. The programmable logic device of claim 18, further comprising a power bus for distributing power to said set of aligned cells.

23. The programmable logic device of claim 18, wherein each signal interface bump of said set of signal interface bumps has a hexagonal configuration.

* * * * *